United States Patent
Ricci et al.

(10) Patent No.: US 7,431,788 B2
(45) Date of Patent: Oct. 7, 2008

(54) METHOD OF PROTECTING A BOND LAYER IN A SUBSTRATE SUPPORT ADAPTED FOR USE IN A PLASMA PROCESSING SYSTEM

(75) Inventors: Anthony Ricci, Sunnyvale, CA (US); Jim Tappan, Fremont, CA (US); Keith Comendant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 496 days.

(21) Appl. No.: 11/183,849

(22) Filed: Jul. 19, 2005

(65) Prior Publication Data

US 2007/0131350 A1    Jun. 14, 2007

(51) Int. Cl.
*B32B 37/00* (2006.01)
(52) U.S. Cl. .................................. 156/153; 156/293
(58) Field of Classification Search .............. 156/153, 156/293
See application file for complete search history.

(56) References Cited

U.S. PATENT DOCUMENTS

| | | | |
|---|---|---|---|
| 5,074,456 | A | 12/1991 | Degner et al. |
| 5,745,331 | A | 4/1998 | Shamouilian et al. |
| 5,753,132 | A | 5/1998 | Shamouilian et al. |
| 5,886,863 | A | 3/1999 | Nagasaki et al. |
| 5,928,528 | A * | 7/1999 | Kubota et al. .......... 216/67 |
| 6,073,577 | A | 6/2000 | Lilleland et al. |
| 6,108,189 | A | 8/2000 | Weldon et al. |
| 6,170,432 | B1 * | 1/2001 | Szapucki et al. ....... 118/723 E |
| 6,194,322 | B1 | 2/2001 | Lilleland et al. |
| 6,310,755 | B1 | 10/2001 | Kholodenko et al. |
| 6,376,385 | B2 | 4/2002 | Lilleland et al. |
| 6,462,928 | B1 | 10/2002 | Shamouilian et al. |
| 6,475,336 | B1 * | 11/2002 | Hubacek .............. 156/345.51 |
| 6,490,146 | B2 | 12/2002 | Wang et al. |
| 6,538,872 | B1 | 3/2003 | Wang et al. |
| 6,721,162 | B2 | 4/2004 | Weldon et al. |

(Continued)

FOREIGN PATENT DOCUMENTS

JP    08-293539 A  *  11/1996

(Continued)

OTHER PUBLICATIONS

International Preliminary Report on Patentability dated Jan. 22, 2008, issued in PCT Application No. PCT/US2006/027090.

*Primary Examiner*—Jeff H Aftergut
(74) *Attorney, Agent, or Firm*—Buchanan Ingersoll & Rooney PC

(57) ABSTRACT

A method of protecting a bond layer in a substrate support adapted for use in a plasma processing system. The method includes the steps of attaching an upper member of a substrate support to a lower member of a substrate support with a bonding material. An adhesive is applied to an outer periphery of the upper member and to an upper periphery of the lower member, and a protective ring is positioned around the outer periphery of the upper member and the upper periphery of the lower member. The protective ring is originally fabricated with dimensions that provide mechanical stability and workability. The protective ring is then machined to an exact set of final dimensions consistent with the design of the substrate support application.

29 Claims, 7 Drawing Sheets

U.S. PATENT DOCUMENTS

| | | |
|---|---|---|
| 6,723,202 B2 | 4/2004 | Nagaiwa et al. |
| 2002/0036881 A1 | 3/2002 | Shamouilian et al. |
| 2003/0211757 A1 | 11/2003 | Gondhalekar et al. |
| 2004/0060661 A1 | 4/2004 | Nishimoto et al. |

FOREIGN PATENT DOCUMENTS

| | | | |
|---|---|---|---|
| JP | 2000-49143 A | * | 2/2000 |
| JP | 2002-299425 A | * | 10/2002 |

* cited by examiner

METHOD OF PROTECTING A BOND LAYER IN A SUBSTRATE SUPPORT ADAPTED FOR USE IN A PLASMA PROCESSING SYSTEM

BACKGROUND

Since the mid-1960s, integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these chips have led them to become a ubiquitous feature of modem digital electronics.

The fabrication of an integrated circuit chip typically begins with a thin, polished slice of high-purity; single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, HBr, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s) which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

The etching reactor electrodes may often be fabricated by bonding two or more dissimilar members with mechanically compliant and/or thermally conductive adhesives, allowing for a multiplicity of function. In a number of etching reactors having a bond line or layer between two members, including electrostatic chuck systems (ESC) where the active ESC component is bonded to a supporting base, or multiple bond layers incorporating an electrode and/or heating element or assembly, the bond line or layer can be exposed to reaction chamber conditions, and is subject to etch out. Accordingly, there is a need to prevent erosion of the bond line or layer, or at least slow the rate sufficiently, such that an extended and acceptable operational lifetime is obtained for the electrode and it's associated bond layer during use in semiconductor etching processes without noticeable degradation to the performance or operational availability of the plasma processing system.

SUMMARY

In accordance with one embodiment, a method of protecting a bond layer in a substrate support adapted for use in a plasma processing system, comprises: attaching an upper member of a substrate support to a lower member of a substrate support; applying an adhesive to an outer periphery of the upper member and to an upper periphery of the lower member; positioning a protective ring around the outer periphery of the upper member and the upper periphery of the lower member; and machining the protective ring to a final dimension.

In accordance with another embodiment, a method of protecting a bond layer in a plasma processing system, comprises: attaching an upper member to a lower member, the upper member having a heating arrangement laminated to a lower surface of the upper member; applying an adhesive to an outer periphery of the upper member and to an upper periphery of the lower member; positioning a fluorocarbon polymer material ring around the outer periphery of the upper member and the upper periphery of the lower member; and machining the fluorocarbon polymer material ring to a final dimension.

In accordance with a further embodiment, a method of protecting a bond layer comprises: attaching an upper member to a lower member; expanding a fluorocarbon polymer material ring to a diameter greater than an outer diameter of the upper member; and shrink fitting the protective ring around the bond line.

In accordance with a further embodiment, a method of protecting a bond layer, the method includes the steps of: bonding an upper member to a lower member; expanding an inner diameter of a protective ring to a diameter greater than an outer diameter of the upper member; and shrink fitting the protective ring around the bond line.

DETAILED DESCRIPTION

Figure 1:
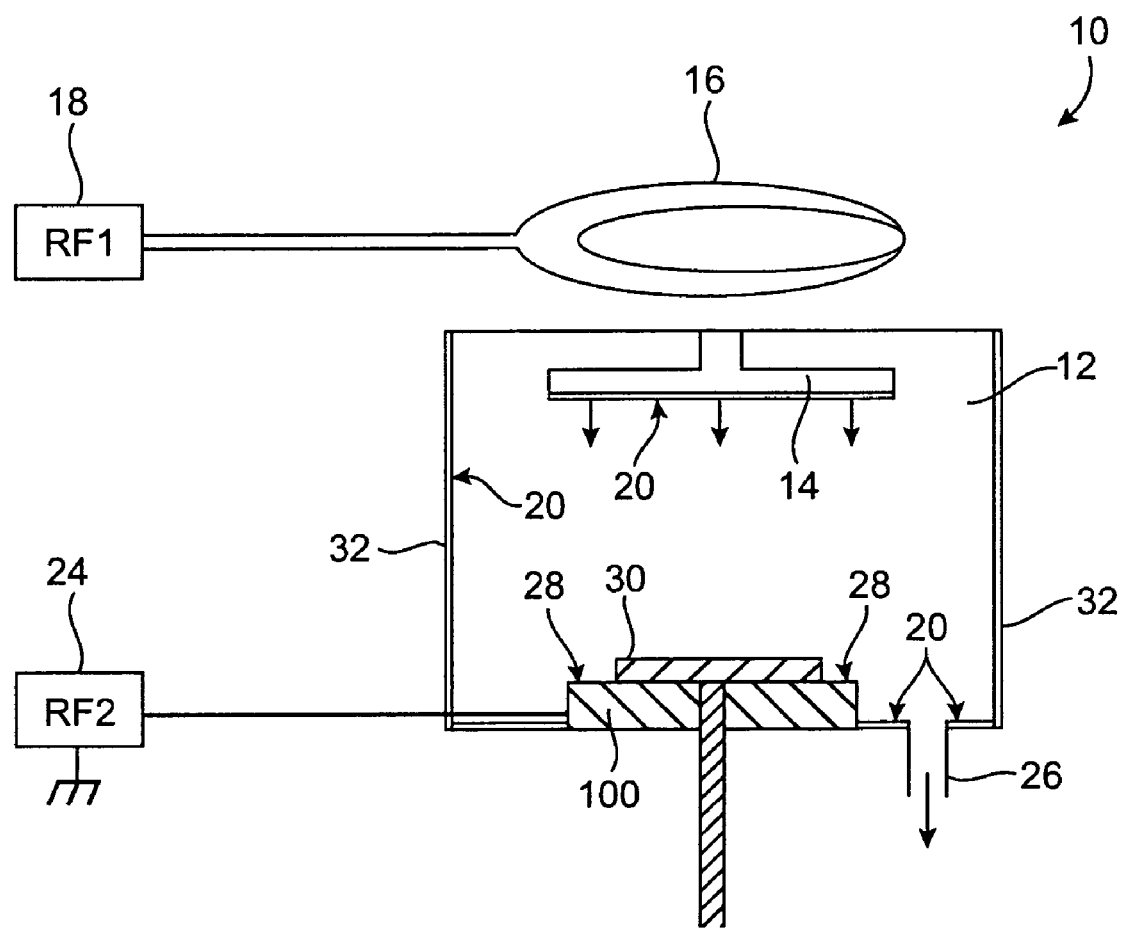
FIG. 1 shows a cross-sectional view of a processing chamber suitable for plasma etching semiconductor substrates.

FIG. 1 shows a cross-sectional view of a plasma reactor 10 for etching substrates. As shown in FIG. 1, the reactor 10 includes a plasma processing chamber 12, an antenna disposed above the chamber 12 to generate plasma, which is implemented by a planar coil 16. The RF coil 16 is typically energized by an RF generator 18 via a matching network (not shown). Within chamber 12, there is provided a gas distribution plate or showerhead 14, which preferably includes a plurality of holes for releasing gaseous source materials, e.g., the etchant source gases, into the RF-induced plasma region between the showerhead 14 and a semiconductor substrate or wafer 30. It can be appreciated that the top of the chamber 12 can be designed to replace the showerhead 14 with various types of plasma generating sources such as capacitive coupled, inductive coupled, microwave, magnetron, helicon, or other suitable plasma generating equipment, wherein the showerhead is a showerhead electrode.

The gaseous source materials may also be released from ports built into the walls of chamber 12. Etchant source chemicals include, for example, halogens such as $Cl_2$ and $BCl_3$ when etching through aluminum or one of its alloys. Other etchant chemicals (e.g., $CH_4$, HBr, HCl, $CHCl_3$) as well as polymer forming species such as hydrocarbons, fluorocarbons, and hydro-fluorocarbons for side-wall passivation may also be used. These gases may be employed along with optional inert and/or nonreactive gases. If desired, the chamber 12 can include additional plasma generating sources (e.g., one or more inductively-coupled coils, electron-cyclotron resonance (ECR), helicon or magnetron type).

In use, a wafer 30 is introduced into chamber 12 defined by chamber walls 32 and disposed on a substrate support or electrode assembly 100, which acts as a lower second electrode, or cathode. It can be appreciated that this lower electrode or electrode assembly can be a bottom electrode of a capacitively coupled plasma reactor or a bottom electrode of an inductively coupled or microwave powered plasma reactor. The wafer 30 is preferably biased by a radio frequency generator 24 (also typically via a matching network). The wafer 30 can comprise a plurality of integrated circuits (ICs) fabricated thereon. The ICs, for example, can include logic devices such as PLAs, FPGAs and ASICs or memory devices such as random access memories (RAMs), dynamic RAMs (DRAMs), synchronous DRAMs (SDRAMs), or read only memories (ROMs). When the RF power is applied, reactive species (formed from the source gas) etch exposed surfaces of the wafer 30. The by-products, which may be volatile, are then exhausted through an exit port 26. After processing is complete, the wafer 30 can be diced to separate the ICs into individual chips.

The plasma exposed surfaces of any plasma confinement apparatus (not shown), chamber wall 32, chamber liner (not shown) and/or showerhead 14 can be provided with a plasma sprayed coating 20 with surface roughness characteristics that promote polymer adhesion. In addition, plasma exposed surfaces of the substrate support 28 can also be provided with a plasma sprayed coating (not shown). In this manner, substantially all surfaces that confine the plasma will have surface roughness characteristics that promote polymer adhesion. In this manner, particulate contamination inside the reactor can be substantially reduced.

It can be appreciated that the reactor 10 can also be used for oxide etch processes. In oxide etch processing, the gas distribution plate is a circular plate situated directly below the window which is also the vacuum sealing surface at the top of the reactor 10 in a plane above and parallel to a semiconductor substrate or wafer 30. The gas distribution ring feeds gas from a source into the volume defined by the gas distribution plate. The gas distribution plate contains an array of holes of a specified diameter which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor 10. The gas distribution plate material is made from a dielectric material to enable coupling of this RF power through the gas distribution plate into the reactor. Further, it is desirable for the material of the gas distribution plate to be highly resistant to chemical sputter-etching in environments such as oxygen or a hydro-fluorocarbon gas plasma in order to avoid breakdown and the resultant particle generation associated therewith.

An exemplary parallel-plate plasma reactor 10 that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode 14 from a gas supply and plasma can be generated in the reactor by supplying RF energy at different frequencies from two RF sources to the showerhead electrode and/or a bottom electrode. Alternatively, the showerhead electrode 14 can be electrically grounded and RF energy at two different frequencies can be supplied to the bottom electrode.

Figure 2:
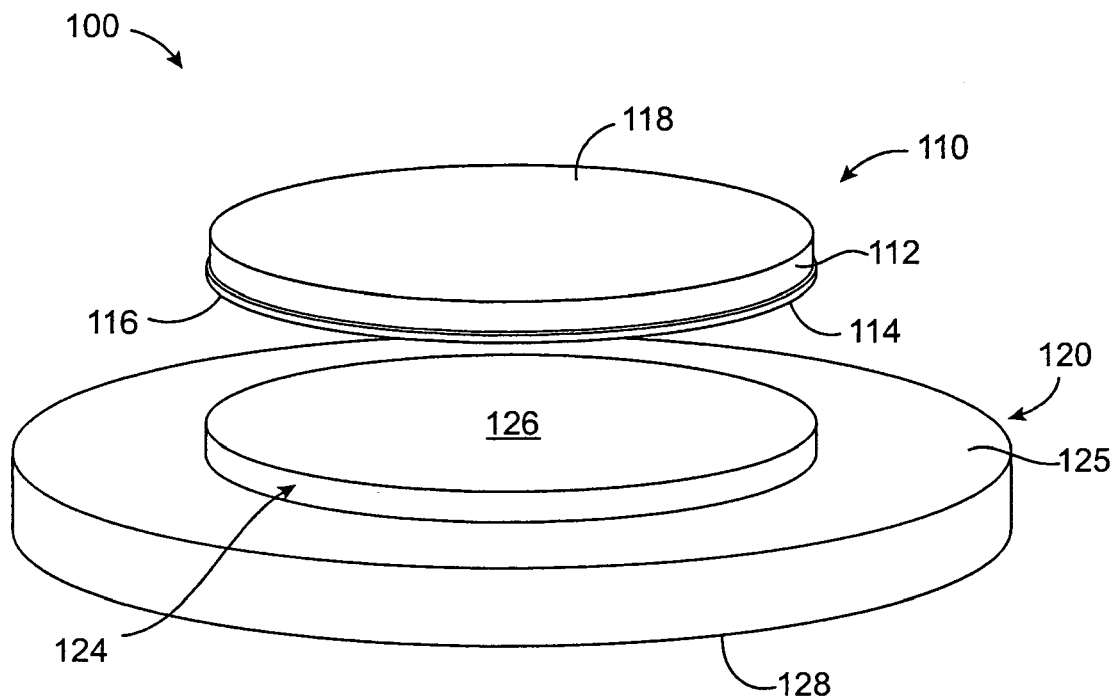
FIG. 2 shows a perspective view of an upper member and lower member of an electrode assembly.

FIG. 2 shows a perspective view of a substrate support comprising an electrode assembly 100 according to one embodiment. The electrode assembly 100 comprises an upper member 110 attached to a lower member 120. The electrode assembly 100 is adapted to be situated within a process chamber of a semiconductor wafer processing system such as, for example, a plasma processing chamber as shown in FIG. 1.

Figure 10:
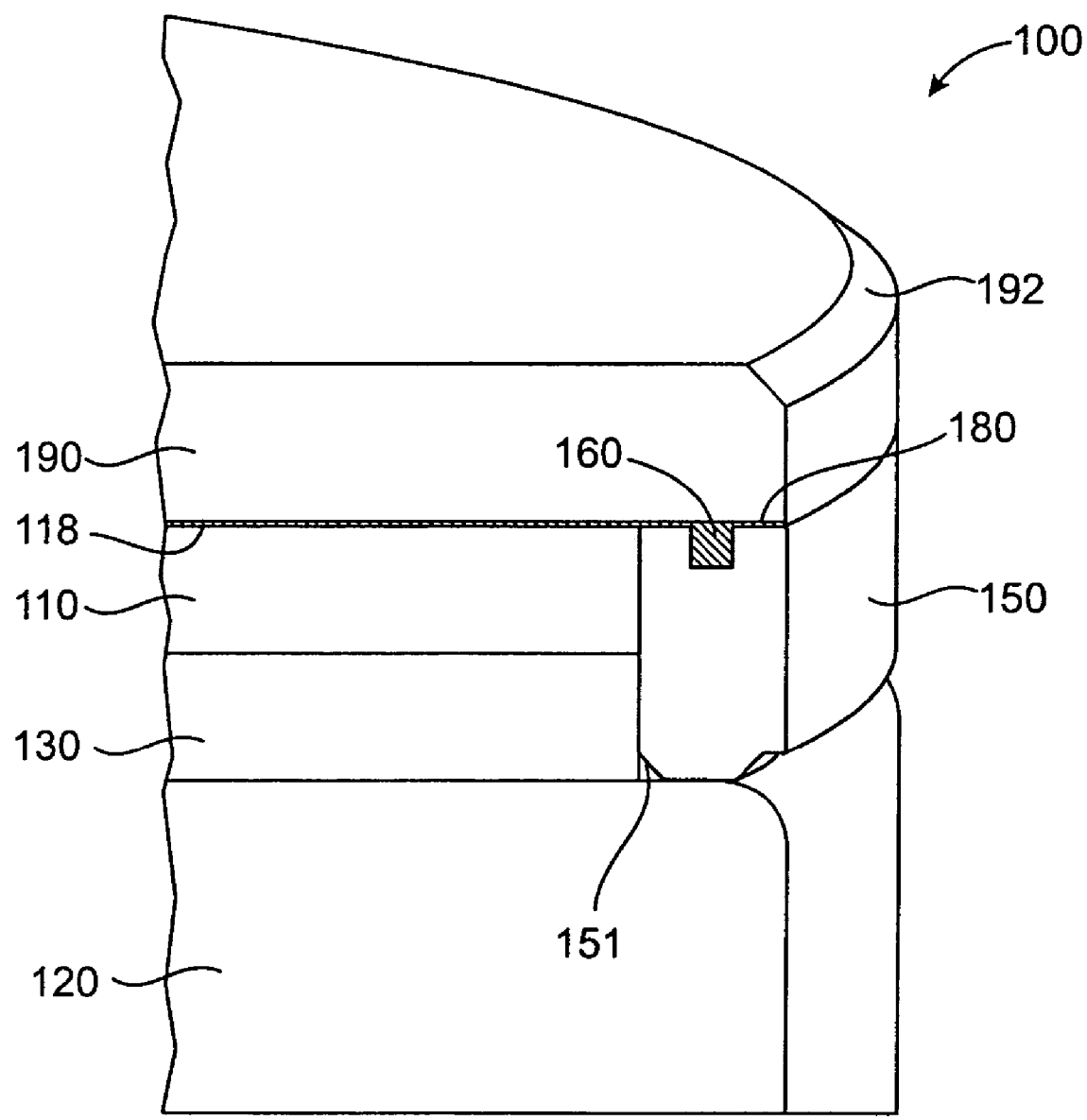
FIG. 10 shows a perspective view of a portion of the electrode assembly after machining to a final dimension.

As shown in FIG. 2, in one embodiment, the upper member 110 comprises an upper plate 112 having a lower flange 114 at the base of the plate 112. The upper member 110 is preferably a circular plate; however, the upper member 110 can be configured in other suitable shapes or designs, such as rectangular for flat panel displays. The upper member 110 comprises a lower surface 116 adapted to be bonded to a lower member 120 and an upper surface 118 configured to be bonded to a substrate support member 190 (FIG. 10).

The upper member 110 preferably consists of an electrode comprised of a metallic material, such as aluminum or an aluminum alloy. However, the upper member 110 can be comprised of any suitable metallic, ceramic, electrically conductive and/or dielectric material. In addition, the upper member 110 preferably has a uniform thickness from the center to the outer edge or diameter thereof.

The lower member 120 is preferably a circular plate having an upper surface 126 and lower surface 128. However, it can be appreciated that the lower member 120 can be configured in suitable shapes other than circular. The upper surface 126 is adapted to bond to the lower surface 116 of the upper member 110. In one embodiment, the lower member 120 can be configured to provide temperature control (e.g., the lower member 120 can include fluid channels therein through which a temperature controlled liquid can be circulated) to the electrode assembly 100. In an electrode assembly 100, the lower member 120 is typically a substrate base plate, of metallic material, and serves as a substrate, a mechanical support, a vacuum seal, isolating the chamber interior from the environment surrounding the chamber, thermal heat sink, RF conductor or combination thereof.

In another embodiment, the upper surface 126 of the lower member 120 further comprises a raised plate in the form of a pedestal 124. The pedestal 124 has a uniform thickness and is configured to support the lower surface 116 of the upper member 110. The pedestal 124 is preferably machined or otherwise formed into an upper surface 125 of the lower member 120. However, other suitable methods of manufacturing can be implemented.

The lower member 120 preferably comprises an anodized aluminum or aluminum alloy. However, it can be appreciated that any suitable material, including metallic, ceramic, electrically conductive and dielectric materials can be used. In one embodiment, the lower member 120 is formed from an anodized machined aluminum block. Alternatively, the lower member 120 could be of ceramic material with one or more electrodes located therein and/or on an upper surface thereof.

The outer diameter of the lower flange 114 of the upper member 110 is preferably less than the outer diameter of the lower member 120. However, it can be appreciated that the outer diameter of the lower flange 114 can be equal to or greater than the outer diameter of the lower member 120. In addition, if the lower member 120 further includes pedestal 124, the outer diameter of the lower flange 114 of the upper member 110 is preferably less than the outer diameter of the pedestal 124 of the lower member 120. The lower flange 114 is adapted to receive a protective ring 150. The outer diameter of the upper member 110 is preferably smaller than the lower flange 114 for ease of positioning the protective ring 150 around the outer periphery of the lower flange 114. The difference in the outer diameter of the upper member 110 and the lower flange 114 allows for clearance of the protective ring during positioning of the protective ring 150. It can be appreciated that the lower flange 114 is optional and the upper member 110 can be designed without a lower flange 114.

Figure 3:
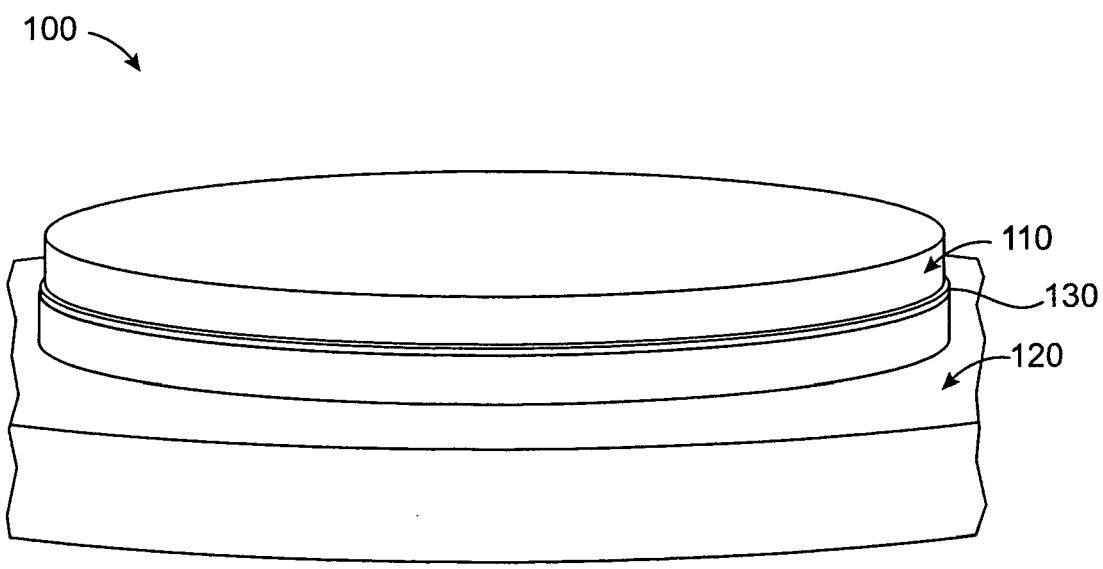
FIG. 3 shows a perspective view of the upper member bonded to the lower member.

FIG. 3 shows a perspective view of the upper member 110 bonded to the lower member 120. As shown in FIG. 3, a bond layer 130 bonds the upper member 110 to the lower member 120. The bond layer 130 is preferably formed from a low modulus material such as an elastomer silicone or silicone rubber material. However, any suitable bonding material can be used. It can be appreciated that the thickness of the bond layer 130 can vary depending on the desired heat transfer coefficient. Thus, the thickness thereof is adapted to provide a desired heat transfer coefficient based on manufacturing tolerances of the bond layer. Typically, the bond layer 130 will vary over its applied area by plus or minus a specified variable. Typically, if the bond layer is at most 1.5 percent plus or minus the thickness thereof, the heat transfer coefficient between the upper and lower member 110, 120 will be uniform.

For example, for an electrode assembly 100 used in the semiconductor industry, the bond layer 130 preferably has a chemical structure that can withstand a wide range of temperatures. Thus, it can be appreciated that the low modulus material can comprise any suitable material, such as a polymeric material compatible with a vacuum environment and resistant to thermal degradation at high temperatures (e.g., up to 500° C.). However, these bond layer material(s) are typically not resistant to the reactive etching chemistry of semiconductor plasma processing reactors and must, therefore, be protected to accomplish a useful part lifetime.

Figure 4:
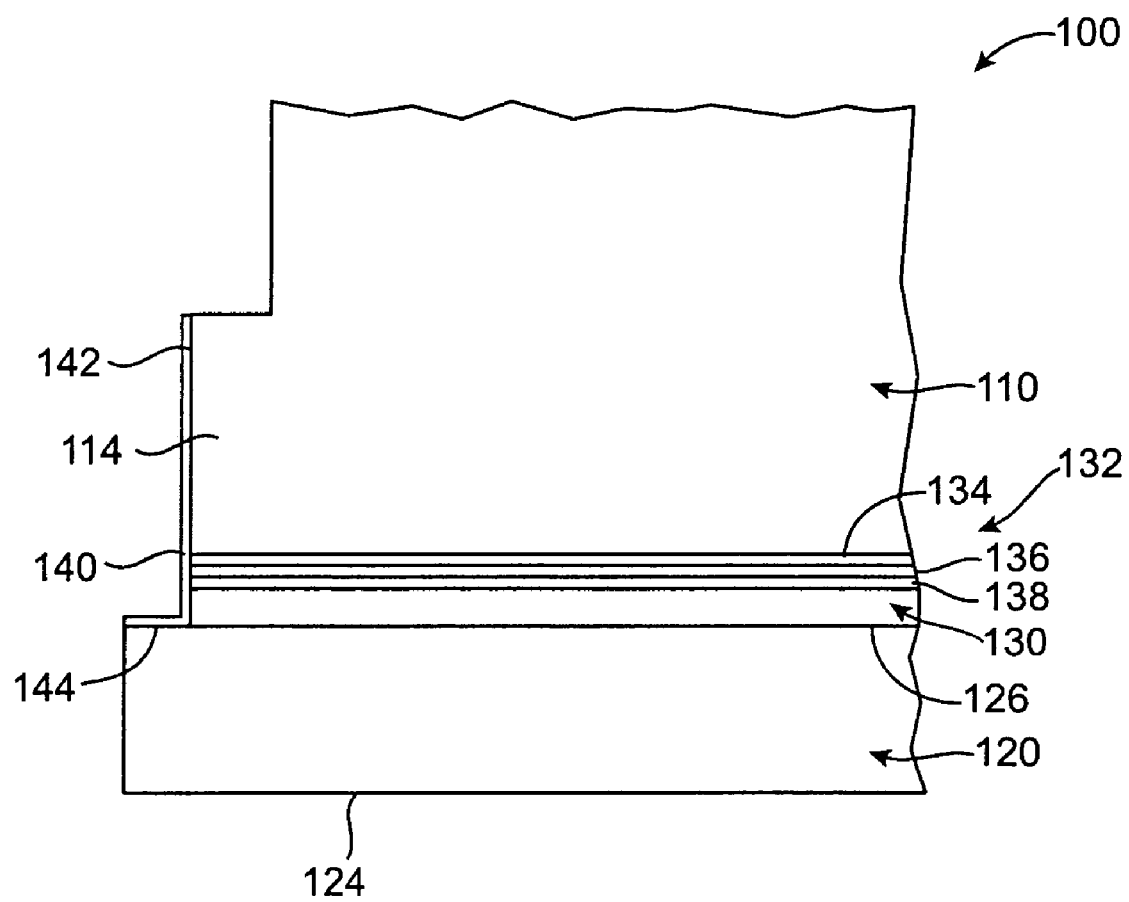
FIG. 4 shows a cross sectional view of a portion of the upper member bonded to the lower member according to FIG. 3.

FIG. 4 shows a cross sectional view of a portion of the electrode assembly 100 having an optional heating arrangement 132 bonded to the lower surface 116 of the upper member 110. The heating arrangement 132 can comprise a laminate border to the lower surface 116 of the upper member 110. For example, heating arrangement 132 can be in the form of a foil laminate comprising a first insulation layer 134 (e.g., dielectric layer), a heating layer 136 (e.g., one or more strips of electrically resistive material) and a second insulation layer 138 (e.g., dielectric layer).

The first and second insulation layers 134, 138 preferably consist of materials having the ability to maintain its physical, electrical and mechanical properties over a wide temperature range including resistance to corrosive gases in a plasma environment such as Kapton® or other suitable polyimide films. The heating layer 136 preferably consists of a high strength alloy such as Inconel® or other suitable alloy or anti-corrosion and resistive heating materials.

In one embodiment, the upper member 110 comprises a heating element 132 in the form of a thin laminate comprising a first insulation layer 134 of Kapton®, patterned together and a heating element 136 of Inconel®, and a second insulation layer 138 of Kapton bonded to the lower surface 116 of the upper member 110. Typically, the heating element 132 in the form of a laminate of Kapton, Inconel and Kapton will be between about 0.005 to about 0.009 of an inch and more preferably about 0.007 of an inch thick.

As shown in FIG. 4, the lower surface 116 of the upper member 110 and/or the heating element 132 is bonded to the upper surface 126 of the lower member 120. In one embodiment, the lower surface 116 of the upper member 110, which comprises the lower flange 114 of the upper member 110, has an outer diameter, which is slightly less than the outer diameter of the upper surface 126 of the lower member 120 or pedestal 124 of the lower member 120. In one embodiment, the electrode assembly 100 can include a bond layer 130 of silicone between the upper member 110 and the lower member 120 of between about 0.001 to about 0.050 of an inch thick and more preferably about 0.003 to about 0.030 of an inch thick.

In addition, as shown in FIG. 4, an adhesive is applied at locations 140 to attach a protective ring 150 (FIG. 5) to an outer periphery (lower vertical surface) 142 of the lower flange 114 of the upper member 110 and an upper periphery 126 (horizontal upper surface) of the lower member 120. As shown in FIG. 4, the adhesive is applied to the outer periphery 142 of the upper member 110 and to an upper periphery 144 of the lower member 120. The adhesive preferably consists of an epoxy or other suitable adhesive material that can be used in environments directly exposed to plasma. The adhesive forms a seal extending between and securing the protective ring 150 to the upper and lower members 110, 120. It can be appreciated that the protective ring 150 can be locked into place or secured to the upper and lower members 110, 120 by additional features such as grooves or slots.

The protective ring 150 preferably is constructed of a polymer such as a fluorocarbon polymer material such as Teflon® (PTFE -PolyTetraFluoroEthylene, manufactured by DuPont®). However, any suitable material including plastic or polymeric materials, Perfluoroalkoxy (PFA), fluorinated polymers, and polyimides can be used. The protective ring 150 is preferably comprised of a material having a high chemical resistance, low and high temperature capability, resistance to plasma erosion in plasma reactor, low friction, and electrical and thermal insulation properties.

Figure 5:
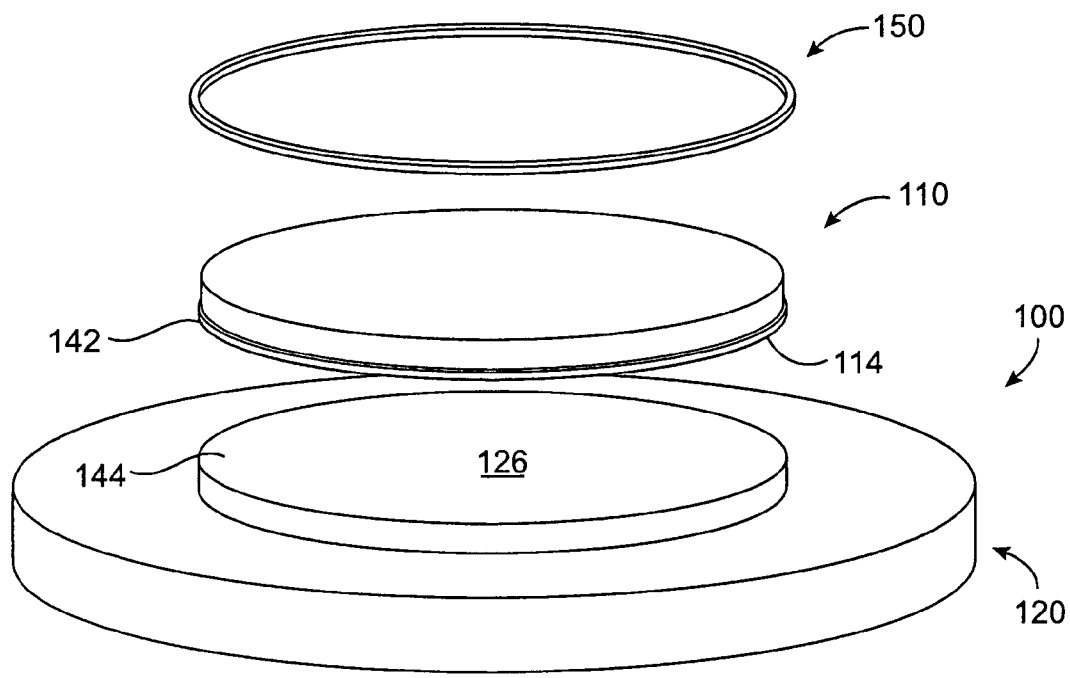
FIG. 5 shows a perspective view of a protective ring prior to installation around the upper member and lower member.

FIG. 5 shows a perspective view of the protective ring 150 prior to installation or positioning of the ring 150 around the outer periphery 142 of the upper member 110 and the upper periphery 144 of the lower member 120. The protective ring 150 preferably consists of a fluorocarbon polymer material ring, which is heat expanded prior to installation. A temperature-controlled oven, hot plate or other suitable method can perform the heating of the protective ring 150. The heating of the protective ring 150 expands the protective ring 150 for ease of installation, to improve the adhesive properties of the protective ring 150 and shrink fitting of the protective ring 150 around the outer periphery 142 of the upper member 110.

In addition, it can be appreciated that the protective ring 150 is preferably heated to a desirable temperature based on the thermal expansion and operating temperatures experienced by the protective ring 150 during processing of semiconductor substrates supported on the upper member 110. For example, in one embodiment, based on the thermal expansion properties and operating temperature of a fluorocarbon-based polymer, such as Teflon®, the protective ring 150 made of Teflon is preferably exposed to a temperature of 60° C. or less. However, the material of each protective ring 150 will have a preferable temperature range for thermal expansion. Thus, the heating of the ring 150 will be chosen based on the selected material and operating temperature cycle in the chamber.

In addition, it can be appreciated that the protective ring 150 can be preheated, chemically treated, and/or include plasma treating to create an irregular or rough surface, to improve the adhesive qualities of the protective ring 150. The pretreatment can improve adhesion of the ring to the upper and lower members and/or condition the plasma exposed surfaces to improve adhesion to polymer by-product build-up thereon during use thereof in a plasma reactor.

Figure 6:
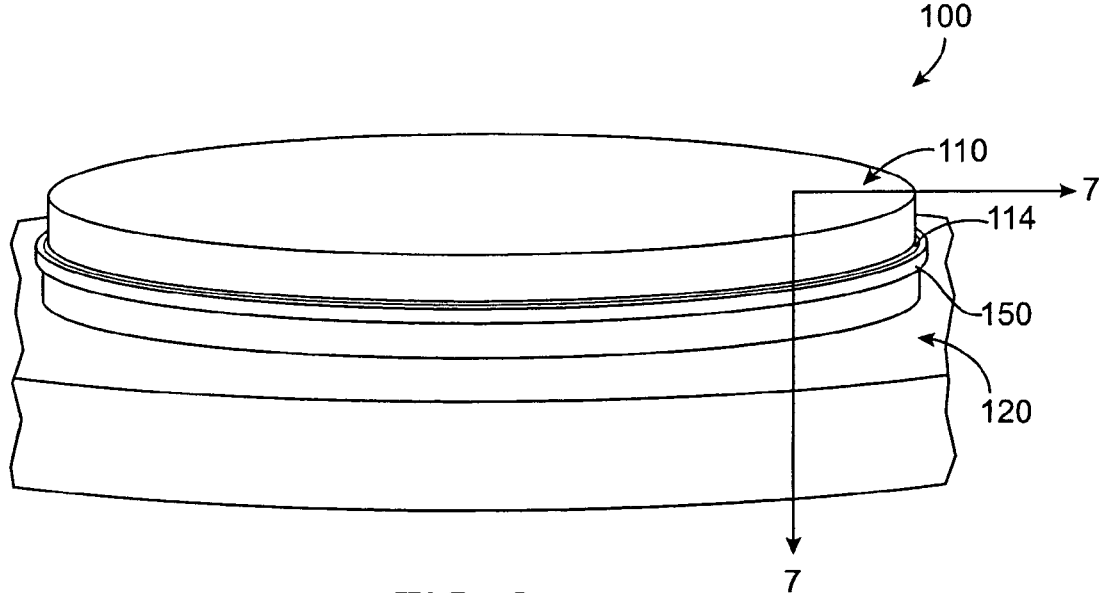
FIG. 6 shows a perspective view of the protective ring of FIG. 5 positioned around a bond line between the upper and the lower members.

FIG. 6 shows a perspective view of the protective ring 150 of FIG. 5 positioned around the outer periphery 142 of the upper member 110. As shown in FIG. 5, the protective ring 150 is positioned around the bottom vertical periphery 142 of the upper member 110 and to the upper periphery 144 of the lower member 120. The curing or shrink fitting of the protective ring 150 shrinks the ring 150 towards its original shape and secures the ring 150 via a compression (shrink) fit to the upper and lower members 110, 120.

In one embodiment, a fluorocarbon-based polymer protective ring 150, such as Teflon is preferably heated to a temperature of at less than 60° C. The protective Teflon ring 150 is preferably heated to approximately 50 to 60° C. and more preferably to approximately 60° C. The heating of the protective ring 150 before installation allows for ease of placement of the protective ring 150 around the upper and lower members 110, 120.

In addition, in one embodiment, the adhesive at locations 140 is in the form of an epoxy, which is cured to a fluorocarbon-based polymer protective ring 150 at a temperature of approximately 90 to 110° C., and more preferably at approximately 100° C.

Figure 7:
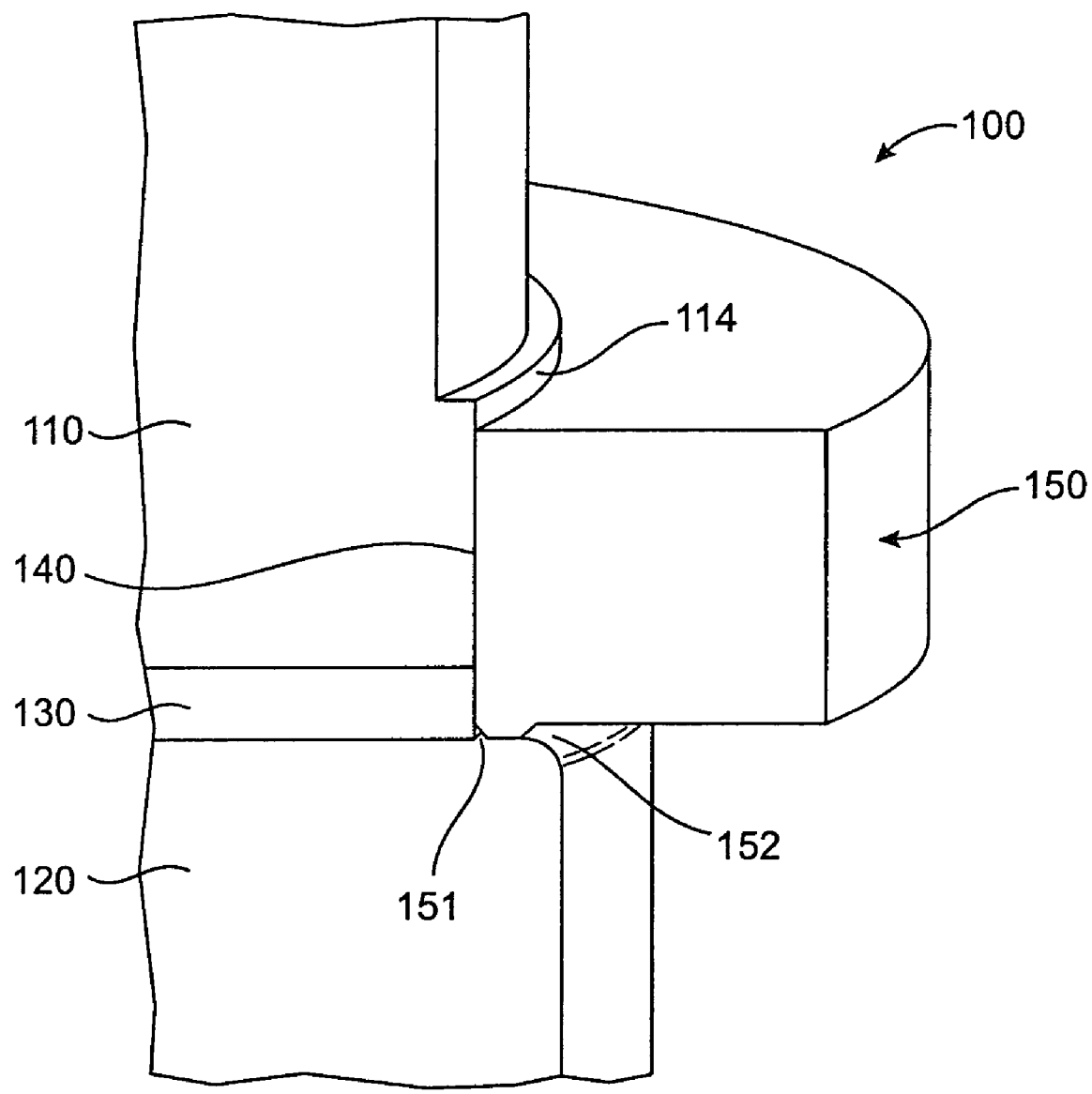
FIG. 7 shows a perspective view of a portion of the electrode assembly of FIG. 6, along line 7-7, including the protective ring positioned around the bond layer.

FIG. 7 shows a perspective view of a portion of the electrode assembly 100 of FIG. 6, along line 7-7, including the ring 150 that protects bonding layer 130 and heating element 132. As shown in FIG. 7, the electrode assembly 100 comprises the heating element 110, the lower member 120, a bond layer 130, an adhesive layer at location 140 and a protective ring 150. The adhesive layer 140 is preferably an epoxy, an acrylic, elastomer or other suitable material having physical properties adapted to withstand the operating temperature ranges in which the assembly 100 is likely to experience.

In one embodiment, the adhesive layer 140 in the form of an epoxy is positioned on the outer periphery 142 of the upper member 110 and to an upper periphery 144 of the lower member 120. As shown in FIG. 7, the protective ring 150 preferably includes an inner and outer chamfered lower surface 151, 152. The inner and outer chamfered lower surface 151, 152 allow the lower edge of protective ring to sit flush on the lower member 120. In addition, the inner chamfered surface 151 provides a volume or area for epoxy to help secure the protective ring 150 to the outer periphery 142 of the upper member 110 and the upper periphery 144 of the lower member 120. The outer chamfered lower surface 152 enables machining of the protective ring 150 without interruption of the integrity of the lower member 120.

Figure 8:
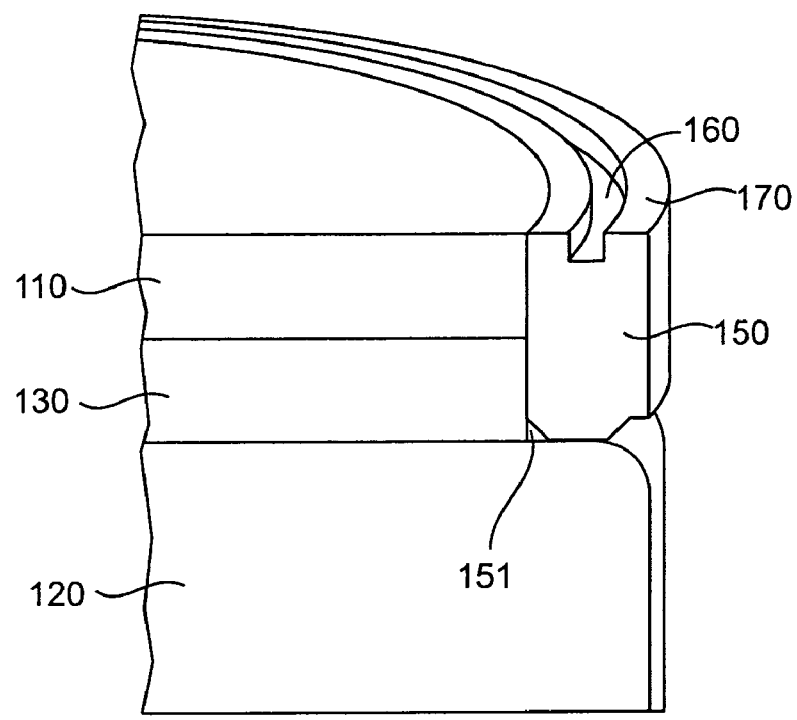
FIG. 8 shows a perspective view of a portion of the electrode assembly of FIG. 7, wherein the protective ring has a groove machined into an upper surface of the ring.

FIG. 8 shows a perspective view of a portion of the electrode assembly 100 of FIG. 7 after machining of the heating element 110, the lower member 120 and the protective ring 150. As shown in FIG. 8, the upper member 110, the lower member 120 and the protective ring 150 are preferably machined to a uniform diameter.

Optionally, in a further embodiment as shown in FIG. 8, the protective ring 150 can include a groove 160 machined or otherwise formed into an upper or top surface 170 of the protective ring 150. The groove 160 is preferably machined into the protective ring 150 after the protective ring 150 is positioned around the outer periphery 142 of the upper member 110. Alternatively, the groove 160 can be machined into the protective ring 150 before installation or positioning of the ring 150 around the outer periphery 142 of the upper member 110. The groove 160 can be filled with adhesive to thereby improve adhesion between the upper member 110 and the protective ring 150 with the wafer overlying support member 190.

Figure 9:
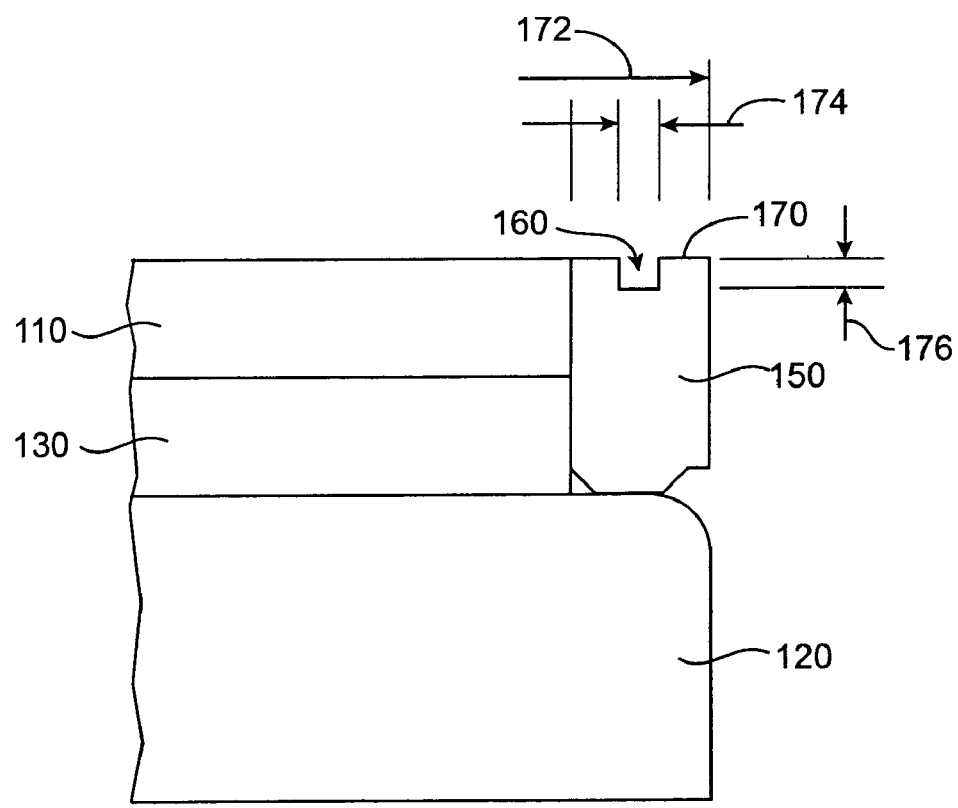
FIG. 9 shows a cross sectional view of a portion of the electrode assembly as shown in FIG. 8 including the groove within the ring.

FIG. 9 shows a cross sectional view of the electrode assembly 100 after machining of the protective ring 150. As shown in FIG. 9, the groove 160 preferably has a square cross section with an equal width 174 and height 176. For example, for a 200 mm diameter electrode assembly 100 having an outer diameter 172 of 7.726 inches, the protective ring 150 preferably has a groove 160 having a width 174 of 0.010 inches and a height 176 of 0.010 inches. However, it can be appreciated that the width 174 and depth 176 of the groove 160 can have any desired cross sectional shape. For square grooves, the dimensions of the groove 160 including the width 174 and depth 176 can vary depending on the diameter or size (i.e., 200 mm, 300 mm, etc.) of the electrode assembly 110, specified for the diameter of the wafer to be processed.

FIG. 10 shows a perspective view of a portion of the electrode assembly 100 after machining to a final width dimension. As shown in FIG. 10, a wafer or substrate support member 190 is bonded to the upper surface 118 of the upper member 110. The wafer support member 190 preferably consists of a ceramic or an electrically conductive material such as a planar silicon (e.g., single crystal silicon), graphite or silicon carbide electrode disc having uniform thickness from the center to the outer edge thereof.

As shown in FIG. 10, the support member 190 can also include a chamfered outer edge 192. The support member 190 (plastic) is preferably bonded to the upper surface 118 of the heating element 110 with another bond layer 180. The bond layer 180 is preferably a low modulus material such as silicone or silicone rubber. The bond layer 180 preferably has a chemical structure that can withstand a wide range of temperature extremes, and can include polymeric materials compatible with a vacuum environment and resistant to thermal degradation at high temperatures.

It can be appreciated that the methods and apparatus described herein can be applied to various electrode assemblies 100 including both 200 mm (7.87402 inches) and 300 mm (11.811 inches) diameter electrode assemblies 100. For example, the protective ring 150 for a 200 mm electrode assembly 100 will comprise an original protective ring 150 having an inner diameter at room temperature of approximately 193.802 mm (7.63 inches), an expanded ring inner diameter (at 60° C.) of approximately 194.818 mm (7.67 inches) and a shrink ring fit diameter at room temperature of approximately 194.564 mm (7.66 inches). For a 300 mm diameter electrode assembly 100, the original protective ring 150 inner diameter at room temperature will be approximately 292.608 mm (11.52 inches), an expanded ring inner diameter (at 60° C.) of approximately 293.878 (11.57 inches) and a shrink ring fit diameter at room temperature of approximately 293.624 mm (11.56 inches).

For example, a fluorocarbon-based polymer protective ring 150 for a 200 mm electrode assembly 100 will expand approximately 0.889 mm (0.035 inches) when heated to 60° C., with a fluorocarbon-based polymer protective ring 150 for 300 mm diameter electrode assembly 100 expanding approximately 1.3462 mm (0.053 inches) when heated to 60° C.

In a preferred embodiment, the electrode assembly 100 is an electrostatic chuck (ESC) useful for clamping substrates such as semiconductor wafers during processing thereof in a vacuum processing chamber for semiconductor fabrication, e.g., a plasma reactor such as a plasma etch reactor. The ESC can be a mono-polar or a bi-polar design. The electrode assembly 100, however, can be used for other purposes such as clamping substrates during chemical vapor deposition, sputtering, ion implantation, resist stripping, etc.

It can be appreciated that the electrode assembly 100 can be installed in any new processing chamber suitable for plasma processing semiconductor substrates or used to retrofit existing processing chambers. It should be appreciated that in a specific system, the specific shape of the upper member 110, the lower member 120 and the support plate 190 may vary depending on the arrangement of chuck, substrate and/or others. Therefore, the exact shape of the upper member 110, the lower member 120 and the support plate 190 as shown in FIGS. 2-10 are shown for illustration purposes only and are not limiting in any way.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. A method of protecting a bond layer in a substrate support adapted for use in a plasma processing system, comprising:
    attaching an upper member of a substrate support to a lower member of a substrate support;
    applying an adhesive to an outer periphery of the upper member and to an upper periphery of the lower member;
    securing a protective ring to the adhesive, and wherein the adhesive forms a seal extending between the protective ring and around the outer periphery of the upper member and the upper periphery of the lower member; and
    machining the protective ring to a final dimension.

2. The method of claim 1, wherein the outer periphery of the upper member has a lower flange.

3. The method of claim 2, further comprising securing the protective ring around an outer periphery of the lower flange.

4. The method of claim 2, further comprising machining the protective ring and the upper member to a final dimension.

5. The method of claim 1, wherein the upper member and the lower member are cylindrical, and the lower member has an outer diameter greater than an outer diameter of the upper member.

6. The method of claim 1, wherein the adhesive is an epoxy.

7. The method of claim 1, further comprising heating the ring before securing the ring around the outer periphery of the upper member and the upper periphery of the lower member.

8. The method of claim 7, further comprising shrink fitting the protective ring around the outer periphery of the upper member and the upper periphery of the lower member.

9. The method of claim 1, wherein the ring is made of a fluorocarbon polymer material.

10. The method of claim 1, wherein the upper member comprises an aluminum plate having a lower flange on which the outer periphery is located.

11. The method of claim 1, further comprising bonding a heating arrangement between the upper member and the lower member.

12. The method of claim 11, wherein the heating element comprises a laminate of a first insulated layer material, a heating layer, and a second insulation layer.

13. The method of claim 1, wherein the upper member comprises an electrode and the lower member comprises a temperature controlled base plate having a pedestal on an upper portion thereof and supporting a lower portion of the upper member.

14. The method of claim 1, wherein the ring has an outer diameter larger than a diameter of the outer periphery of the lower member, the method further comprising machining the ring such that the outer diameter thereof corresponds to the outer diameter of the outer periphery of the lower member.

15. The method of claim 1, further comprising chamfering the ring prior to attaching the ring to the upper and lower members.

16. The method of claim 1, further comprising machining a groove into an upper surface of the ring.

17. The method of claim 1, further comprising bonding a substrate support member to an upper surface of the upper member.

18. A method of protecting a bond layer in a plasma processing system, comprising:
    attaching an upper member to a lower member, the upper member having a heating arrangement laminated to a lower surface of the upper member;
    applying an adhesive to an outer periphery of the upper member and to an upper periphery of the lower member;
    securing a fluorocarbon polymer material ring to the adhesive, and wherein the adhesive forms a seal extending between the protective ring and around the outer periphery of the upper member and the upper periphery of the lower member; and
    machining the fluorocarbon polymer material ring to a final dimension.

19. The method of claim 18, further comprising machining the fluorocarbon polymer material ring and upper member to a final dimension.

20. The method of claim 18, wherein the upper member and the lower member are cylindrical, and the lower member has an outer diameter greater than an outer diameter of the upper member.

21. The method of claim 18, wherein the adhesive is an epoxy.

22. The method of claim 18, further comprising heating the fluorocarbon polymer material ring before securing the fluorocarbon polymer material ring around the outer periphery of the upper member and the upper periphery of the lower member.

23. The method of claim 22, further comprising shrink fitting the fluorocarbon polymer material ring around the outer periphery of the upper member and the upper periphery of the lower member.

24. The method of claim 18, wherein the upper member comprises an aluminum plate having a lower flange on which the outer periphery is located.

25. The method of claim 18, wherein the heating arrangement comprises a laminate of a first insulation layer, a heating layer and a second insulation layer.

26. The method of claim 18, wherein the upper member comprises an electrode and the lower member further includes a pedestal on an upper portion thereof and supporting a lower portion of the upper member.

27. The method of claim 18, further comprising chamfering a lower surface of the ring prior to attaching the ring to the upper and lower members.

28. The method of claim 18, further comprising machining a groove into an upper surface of the ring.

29. The method of claim 18, further comprising bonding a substrate support member to an upper surface of the upper member.

* * * * *